(12) United States Patent
Kirschner et al.

(10) Patent No.: US 7,225,094 B2
(45) Date of Patent: May 29, 2007

(54) ELECTRONIC CIRCUIT FOR MEASURED PARAMETER RECORDING

(75) Inventors: Manfred Kirschner, Stuttgart (DE); Reiner Schweinfurth, Eppingen (DE); Johannes Meiwes, Markgroeningen (DE); Alex Grossmann, Gernsbach (DE); Eberhard Klein, Plochingen (DE); Bernd Tepass, Beilstein (DE); Torsten Baumann, Eppingen-Adelshofen (DE)

(73) Assignee: Robert Bosch GmbH, Stuttgart (DE)

(*) Notice: Subject to any disclaimer, the term of this patent is extended or adjusted under 35 U.S.C. 154(b) by 117 days.

(21) Appl. No.: 10/517,700

(22) PCT Filed: Mar. 25, 2004

(86) PCT No.: PCT/DE2004/000616

§ 371 (c)(1),
(2), (4) Date: Dec. 13, 2004

(87) PCT Pub. No.: WO2004/112253

PCT Pub. Date: Dec. 23, 2004

(65) Prior Publication Data

US 2005/0235028 A1    Oct. 20, 2005

(30) Foreign Application Priority Data

May 23, 2003    (DE) ................ 103 23 498

(51) Int. Cl.
*G06F 19/00* (2006.01)
(52) U.S. Cl. .......................... 702/85; 702/104
(58) Field of Classification Search ................ 73/1.34; 702/85, 193, 104
See application file for complete search history.

(56) References Cited

U.S. PATENT DOCUMENTS 5,172,115 A * 12/1992 Kerth et al. ............. 341/118

FOREIGN PATENT DOCUMENTS

DE    196 29 747 A1    1/1998

* cited by examiner

*Primary Examiner*—Michael Nghiem
*Assistant Examiner*—Douglas N Washburn
(74) *Attorney, Agent, or Firm*—Michael J. Striker

(57) ABSTRACT

An electronic circuit for detecting measured quantities has a sensor unit for generating an analog measurement signal and a signal detecting unit (120) with a first analog/digital converter for digitizing the analog measurement signal. Differences in the fluctuations of the supply voltages that are supplied to the sensor unit and the signal detecting unit essentially result in the generation of undesirable fluctuations in the measurement signal. To minimize these effects or compensate for them, the digitized measurement signal is corrected In response to a voltage signal (U) that represents the imprecision x1 of the first supply voltage (VS1).

13 Claims, 4 Drawing Sheets

ELECTRONIC CIRCUIT FOR MEASURED PARAMETER RECORDING

CROSS-REFERENCE

The invention described and claimed hereinbelow is also described in PCT/DE 2004/000616, filed Mar. 25, 2004 and DE 103 23 498.5, filed May 23, 2003. This German Patent Application, whose subject matter is incorporated here by reference, provides the basis for a claim of priority of invention under 35 U.S.C. 119(a)–(d).

The invention relates to an electronic circuit for detecting measured quantities, a method for operating a correction unit as a component of the electronic circuit, and a computer program for executing this method.

BACKGROUND OF THE INVENTION

Electronic circuits for detecting measured quantities are fundamentally known from the prior art. Circuits of this kind usually have at least one sensor unit for generating an analog measurement signal, which represents a measured quantity detected by the sensor. Electronic circuits of this kind also have a signal detecting unit, which is, as a rule, integrated into a control unit, particularly in the automotive field. The signal detecting unit usually has a first analog/digital converter for digitizing the analog measurement signal. These electronic circuits are also associated with a voltage supply unit to provide a supply voltage for both the sensor unit and the signal detecting unit.

Traditionally, both the sensor unit and the signal detecting unit are operated from the same voltage source, with quantitatively equal supply voltages, these supply voltages being subject to the same error tolerance or imprecision. Because of this uniformity of the imprecisions in the voltage supply signals, this is also referred to as a simultaneous or ratiometric voltage supply.

Basically, it is assumed that the imprecisions or fluctuations in the supply voltage in the sensor unit also affect the analog measurement signal that it generates. Because of the subsequent digitizing of the analog measurement signal by an analog/digital converter, which is operated with a synchronous supply voltage, i.e. one that has the same imprecisions as that of the sensor unit, these imprecisions are compensated for in the digitized measurement signal emitted at the output of the analog/digital converter. Therefore with a traditional ratiometric supply of voltage to both the sensor unit and the signal detecting unit, fluctuations in the supply voltage have no effect on the measurement signal. The reason for this is that if these fluctuations occur, they do so to the same degree in both the sensor unit and the signal detecting unit and are therefore imperceptible and/or cancel each other out.

Future control units and/or signal detecting units will probably be operated with a quantitatively lower supply voltage than the present standard of 5 V. The components contained in the signal detecting units such as microcontrollers or analog/digital converters, particularly embedded analog/digital converters, will therefore also be operated with the lower supply voltage, for example 3.3 V. But at least for a transition period, the existing sensor units will continue to be used, which will still be operated preferably with 5 V. As a result, different voltage sources must be provided for the different supply voltages for the sensor unit and the signal detecting unit. There is therefore a significant risk of losing the ratiometry in the voltage supply, i.e. the homogeneity of the imprecisions of the two supply voltages, and therefore also the above-described advantage of the compensation for the imprecisions in the measurement signal. The reason for this is essentially that the different voltage sources for the separate supply voltages can have different individual imprecisions with regard to their voltage supply.

Based on this prior art, the object of the invention is to modify the known electronic circuit for detecting measured quantities, a method for operating such a circuit, and a computer program for executing this method in such a way that even when the sensor unit and the signal detecting unit are each supplied with respective supply voltages of differing precision, these different precisions are prevented from affecting the measurement signal emitted by the signal detecting unit.

This object is attained by the subject of claim 1, which proposes that the signal detecting unit have a correction unit that compensates for the effects of the imprecisions $x1$ and/or $x2$ on the digitized measurement signal in response to a digitized voltage signal representing the imprecision of the first supply voltage and emits a compensated digital measurement signal resulting from this compensation.

It should in particular be noted at this point that the analog measurement signal is generated by the sensor unit, which is operated with the first supply voltage that has an imprecision of $x1$. The analog measurement signal is then digitized by the first analog/digital converter, which is operated with a second supply voltage that has an imprecision of $x2$.

SUMMARY OF THE INVENTION

Even when there are different imprecisions $x1$ and $x2$ of the above-mentioned supply voltages, the correction unit according to the present invention advantageously compensates for the effects of these imprecisions on the measurement signal.

In particular, imprecisions and fluctuations in the supply voltages result in corresponding imprecisions in the measurement signal.

The correction unit according to the present invention is advantageously embodied so that it calculates a normalization factor $N$ by which the digitized measurement signal is multiplied in order to obtain the compensated digital measurement signal. The normalization factor $N$ is calculated by dividing values of the digitized measurement signal by values of a digitized voltage signal, which represents the imprecision of the first supply voltage with which the sensor unit is operated.

In the event that the first supply voltage for operating the sensor unit is quantitatively greater than the second supply voltage for operating the signal detecting unit, the invention provides a preferably high-precision voltage divider in order to generate the voltage signal based on the first supply voltage through division. This assures that the voltage signal can be evaluated and processed by the components inside the signal detecting unit, which are operated with the lower, second supply voltage.

Also in cases in which the sensor unit is to be operated with a quantitatively greater supply voltage than the signal detecting unit, it is necessary to limit the amplitude of the analog measurement signal generated by the sensor unit. This limitation can be achieved on the one hand by means of a characteristic curve limitation unit provided in the sensor unit. Alternatively, a second possibility for limiting the amplitude of the analog measurement signal is to provide a voltage divider circuit after the sensor unit without a characteristic curve limitation unit. This voltage divider circuit is preferably designed not only with a desired amplitude of the analog measurement signal in mind, but also with other requirements in mind, such as impedance matching to the sensor unit. Naturally, a limitation of the amplitude of the measurement signal can also be achieved by a combination of a characteristic curve limitation unit and a voltage divider circuit.

The above-mentioned object is also attained by means of a method for operating the electronic circuit for detecting measured quantities and by means of a computer program for carrying out this method. The advantages of these embodiments correspond to the advantages mentioned above in connection with the electronic circuit.

BRIEF DESCRIPTION OF THE DRAWINGS

The invention will be explained in greater detail below in the form of various exemplary embodiments in conjunction with the figures accompanying the specification.

DETAILED DESCRIPTION OF THE EXEMPLARY EMBODIMENTS

Figure 1:
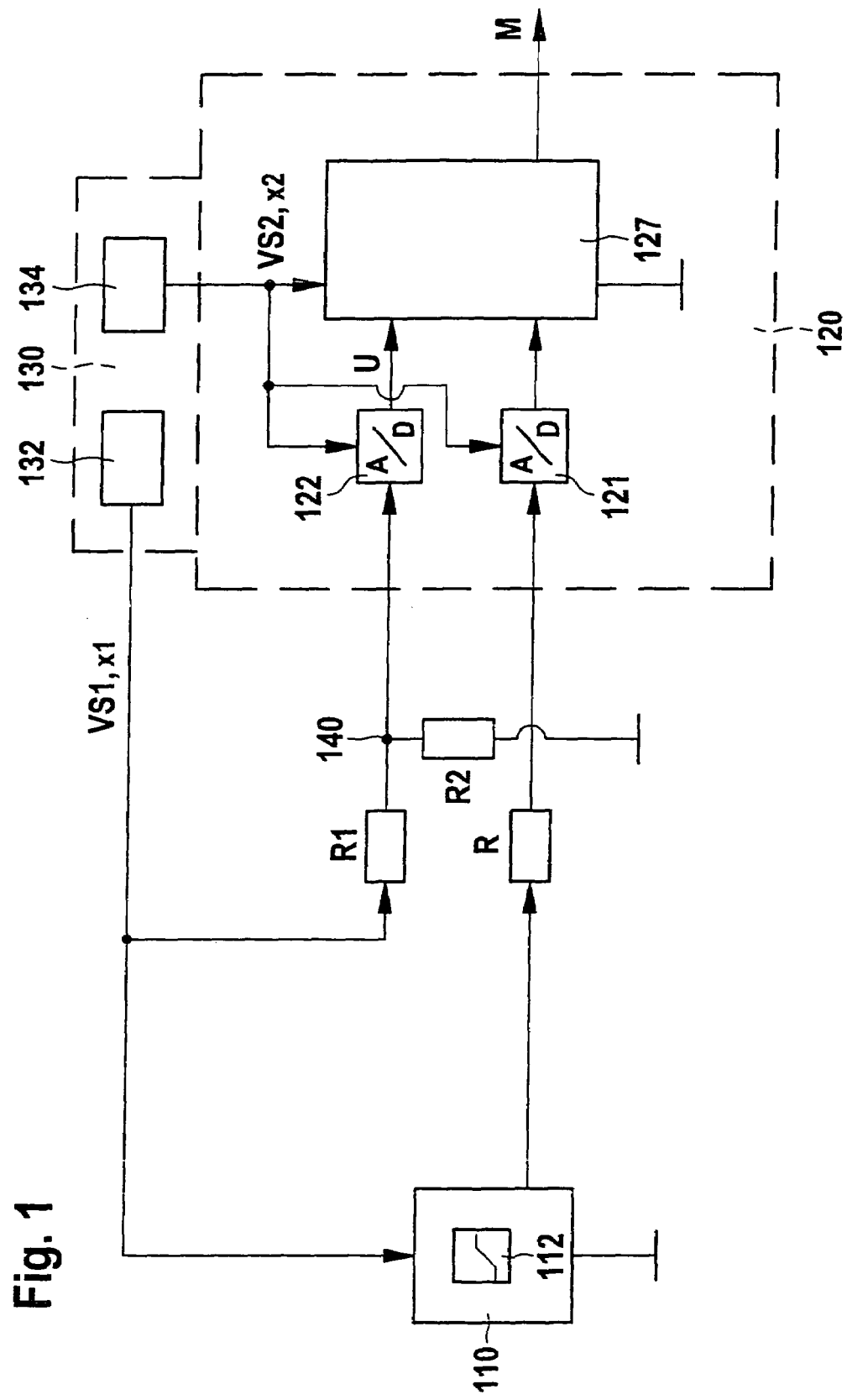
FIG. 1 shows a first exemplary embodiment of an electronic circuit for detecting measured quantities.

FIG. 1 shows a first exemplary embodiment of the electronic circuit for detecting measured quantities. It includes at least one sensor unit 110 for generating an analog measurement signal, which represents a measured quantity detected by the sensor unit 110. The electronic circuit also includes a signal detecting unit 120, which is preferably integrated into a control unit, e.g. for a motor vehicle. In particular, this signal detecting unit 120 includes a first analog/digital converter 121 for digitizing the analog measurement signal generated by the sensor unit 110. The electronic circuit also includes a voltage supply unit 130 with a first voltage source 132 for producing a first supply voltage VS1 for the sensor unit 110. This first supply voltage VS1 is encumbered with an imprecision—i.e. voltage fluctuations in particular—of x1, which is preferably expressed in percent. The voltage supply unit also has a second voltage source 134 for producing a second supply voltage VS2, which is encumbered with an imprecision of x2, preferably also expressed in percent.

According to the present invention, the signal detecting unit 120 also has a correction unit 127, which serves to compensate for the imprecisions x1 and/or x2 and for their effects on the digitized measurement signal. At its output, this correction unit therefore emits a compensated digital measurement signal M.

Figure 2:
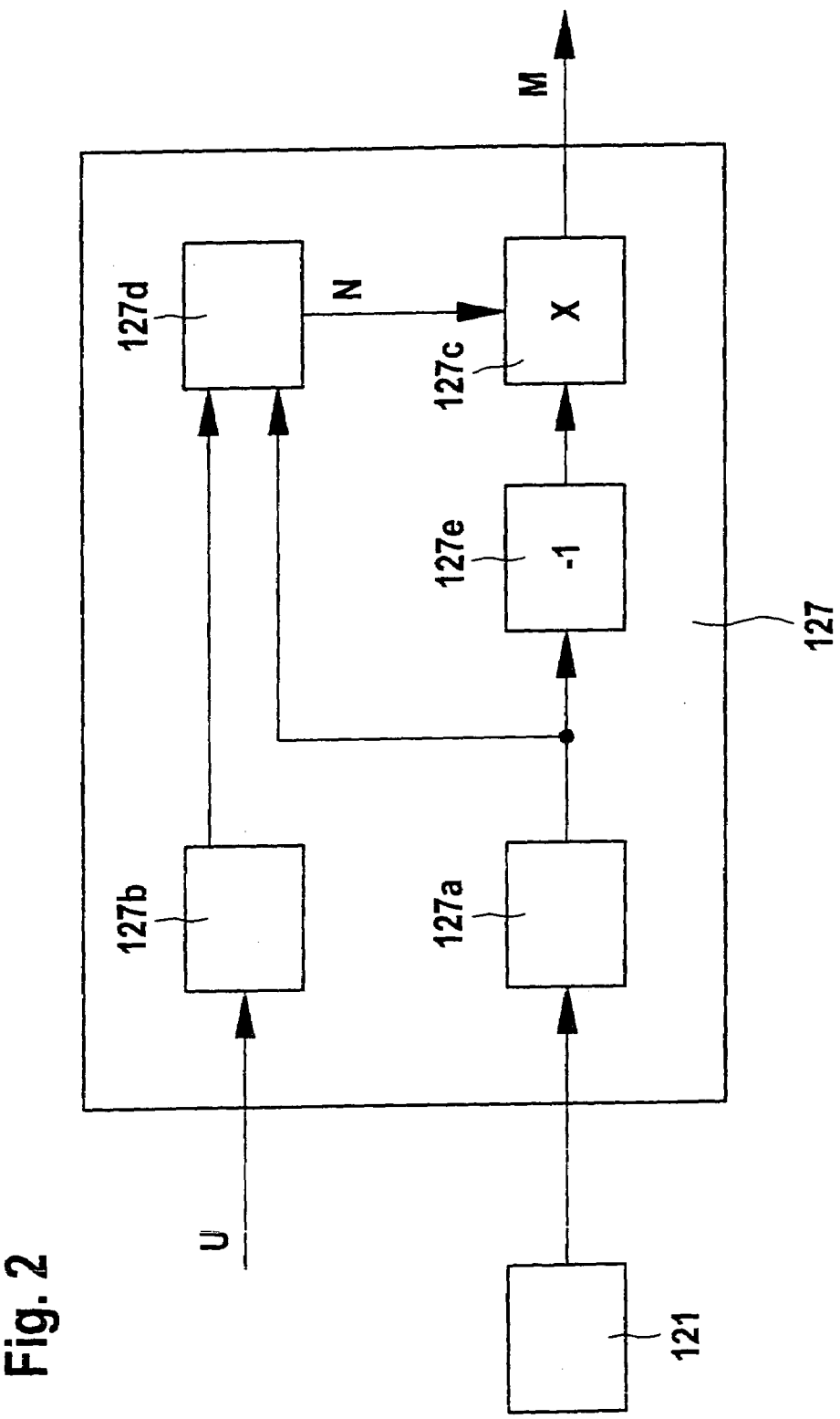
FIG. 2 shows the design of a correction unit according to the present invention.

The design and operation of the correction unit 127 are shown in FIG. 2. According to this figure, the correction unit has a first memory element 127a, for example a register, for storing present output values of the first analog/digital converter 121, i.e. present values of the digitized measurement signal. The correction unit 127 also has a second memory element 127b, for example a second register, for storing the present values of a digitized voltage signal, which represents the imprecision x1 of the first supply voltage VS1. In both cases, the term "present values" is understood to mean the values at time n. The contents of the first and second memory elements 127a and 127b at time n are supplied to a normalization unit 127d. Based on these input values, the normalization unit 127d calculates a normalization factor N by dividing the content of the first memory element 127a at time n by the content of the second memory element 127b at time n. The normalization factor N calculated in this way is then multiplied by the content of the first memory element 127a at time n with the aid of a multiplying unit 127c in order to thus obtain the compensated digitized measurement signal M. The delay element 127e also provided in the correction unit 127 delays the supplying of the content of the first memory element 127a to the multiplying unit 127c until the associated normalization factor N has been calculated.

Statements made above with regard to the design of the electronic circuit according to FIG. 1 and the design of the correction unit 127 according to FIG. 2 apply equally to all other exemplary embodiments of the invention.

The differences between the individual exemplary embodiments of the circuit will be described in greater detail below.

FIG. 1 shows a first exemplary embodiment of the electronic circuit or more precisely stated, a first exemplary embodiment for producing the voltage signal U, which represents the imprecision x1 of the first supply voltage VS1. In the event that the first supply voltage VS1 is quantitatively greater than the second supply voltage VS2, according to the first exemplary embodiment shown in FIG. 1, the voltage signal U is generated with the aid of a preferably high-precision voltage divider R1, R2, which is connected between the first supply voltage VS1 and ground. The voltage signal U is initially picked up in analog form at the connection 140 between the series connected resistances or impedances R1, R2. A second analog/digital converter 122 then digitizes the analog voltage signal, which yields the voltage signal U. At this point, it is important to emphasize that both the analog and digitized voltage signals represent the imprecision x1 of the first supply voltage VS1. It is also important to note that just like the first analog/digital converter 121, the second analog/digital converter 122 is operated with the second supply voltage VS2, which has the imprecision x2. The digitized voltage signal U calculated in this way is then read into the correction unit 127 or more precisely stated, into the second memory element 127b and then further processed as explained above in connection with FIG. 2.

In addition to the first exemplary embodiment for generating the voltage signal U described immediately above, FIG. 1 also shows a first exemplary embodiment for achieving a voltage limitation of the analog measurement signal generated by the sensor unit 110. It is necessary to limit the amplitude of this measurement signal because of the precondition that the first supply voltage VS1 is greater than the second supply voltage VS2 that is used to operate the signal detecting unit 120 in which the analog measurement signal is to be further processed. According to the first exemplary embodiment, the voltage limitation is achieved by means of a characteristic curve limitation unit 112 associated with the sensor unit 110. The connecting line between the output of the sensor unit 110 and the first analog/digital converter 121 is then as a rule provided with only one resistance R for voltage limitation or impedance matching.

Figure 3:
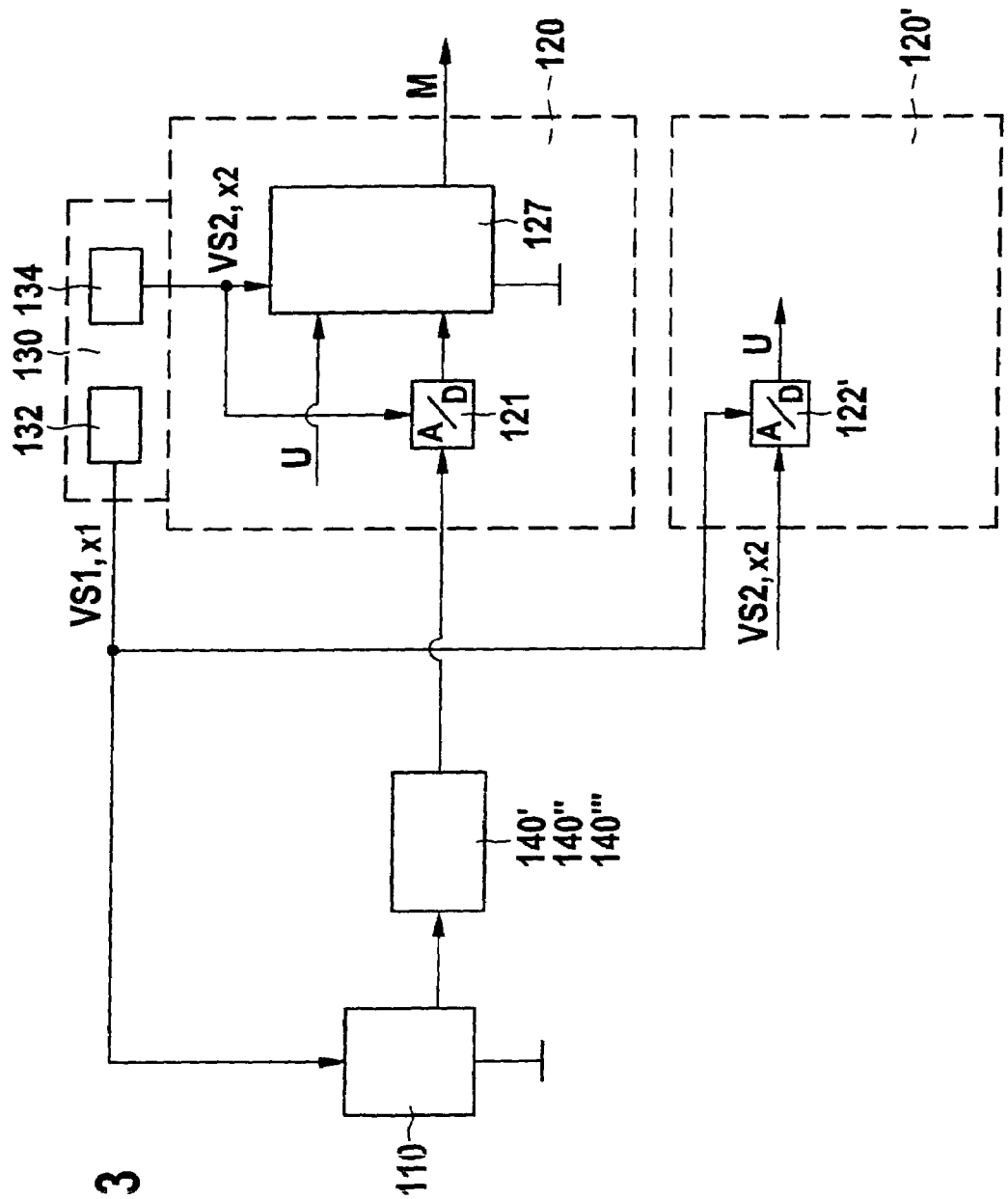
FIG. 3 shows a second exemplary embodiment for the electronic circuit.

FIG. 3 shows a second exemplary embodiment for generating the digitized voltage signal U and a second exemplary embodiment for achieving the required voltage limitation for the analog measurement signal.

According to FIG. 3, the digitized voltage signal U can also be generated by digitizing the second supply voltage VS2, which has the imprecision x2, by means of a second analog/digital converter 122'. It is important here that this second analog/digital converter 122' is operated with the first supply voltage VS1, which has the imprecision x1. The second analog/digital converter can, for example, be provided in a second signal detecting unit 120', this second signal detecting unit preferably being integrated into the control unit along with the first signal detecting unit 120. This second exemplary embodiment for generating the digitized voltage signal U has the advantage that the second analog/digital converter 122' makes it possible to use a component that may be present anyway, thus permitting elimination of the voltage divider R1, R2, which is relatively expensive because of its high-precision design.

FIG. 3 also discloses an alternative possibility for achieving the voltage limitation of the analog measurement signal. According to FIG. 3, this limitation is carried out by a divider circuit 140 provided between the output of the sensor unit 110 and the input of the analog/digital converter 121. In this second exemplary embodiment, the characteristic curve limitation unit 112 provided in the first exemplary embodiment can essentially be eliminated.

Figure 4A:
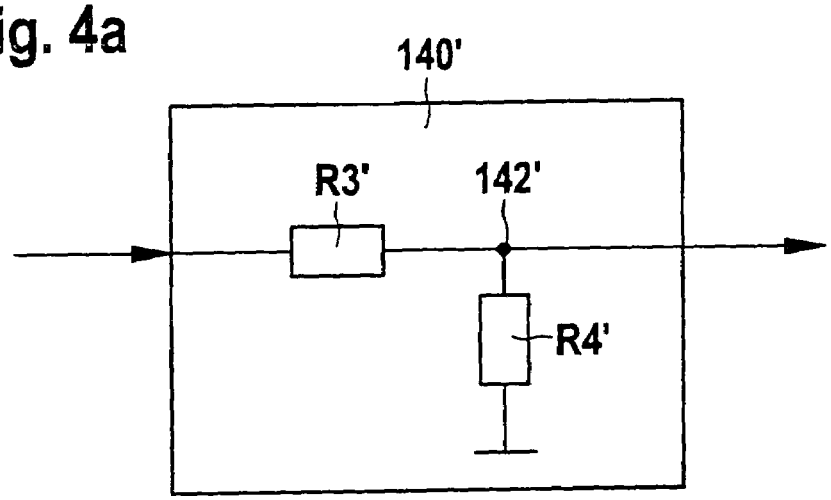
FIG. 4a shows a first exemplary embodiment for a voltage divider circuit.
Figure 4B:
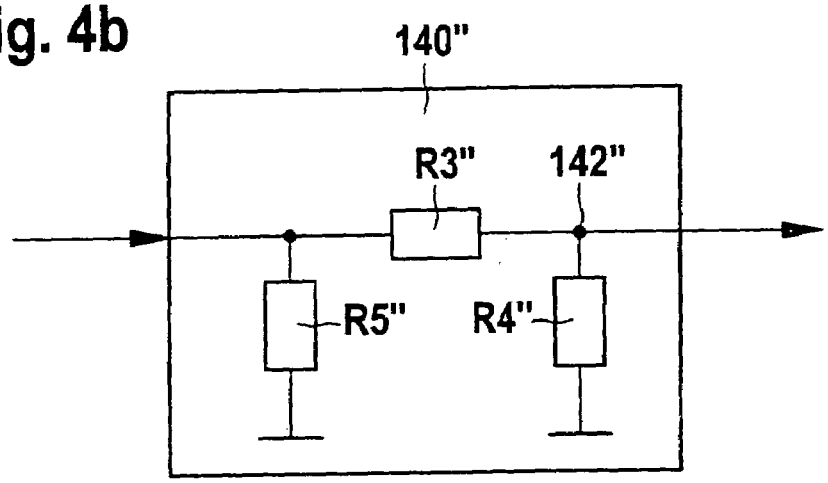
FIG. 4b shows a second exemplary embodiment for the voltage divider circuit.
Figure 4C:
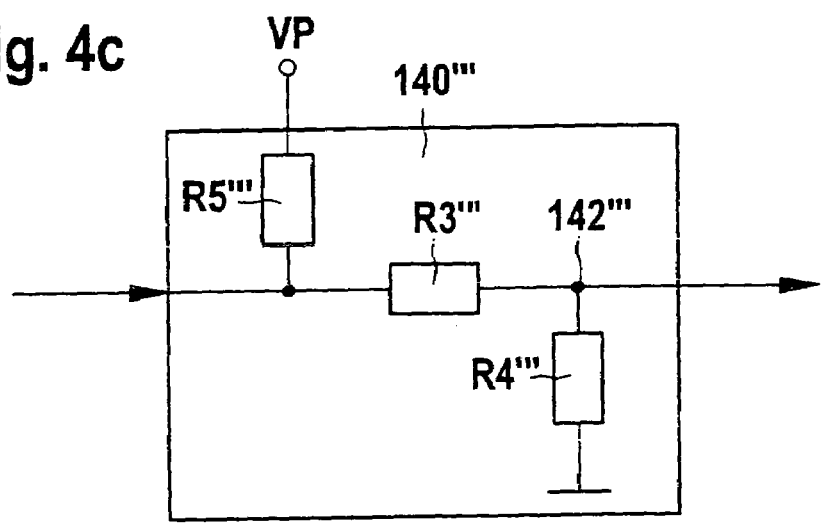
FIG. 4c shows a third exemplary embodiment for the voltage divider circuit.

FIGS. 4a, 4b, and 4c show different variants for embodying the voltage divider circuit 140.

FIG. 4a shows a first variant in which the voltage divider circuit 140 has only a single voltage divider comprised of the resistances R3' and R4'. These two resistances R3' and R4' are series connected to ground at the opposite end from the output of the sensor unit 110. They are dimensioned so that the divided analog measurement voltage, whose maximum amplitude corresponds quantitatively to the second supply voltage VS2, can be picked up at their middle pickup point 142'. In lieu of these two separate resistances R3' and R4', it is naturally also possible to provide a one-piece resistance with a middle pickup point. This offers advantages in terms of the tolerancing and/or precision of the pickup point.

In a second variant to the embodiment of the voltage divider circuit 140" shown in FIG. 4b, the resistances or impedances R3", R4" have the same functions as the resistances R3' and R4' in the first variant. By contrast with the first variant, however, the second variant also provides a resistance R5" parallel connected to the output of the sensor unit 110. This resistance R5" is used for impedance matching.

The third variant for the voltage divider unit 140''' is provided for sensor units whose output stage must be operated with a pull-up resistance. Here, too, the resistances R3''' and R4''' perform the same voltage divider function as described above in connection with variant 1. But a pull-up resistance R5''' is also provided, whose one end is connected between the output of the sensor unit 110 and the resistance R3''' and whose other end is connected to a voltage VP, for example VS1.

The voltage limitation, whether it be in the form of a characteristic curve limitation unit 112 or in the form of one of the variants for the voltage divider circuit 140, makes it possible for existing sensor units to continue to be used with their prior supply voltage level even if the signal detecting units are operated with a lower supply voltage level.

The design described further above and the operation of the correction unit 127 that has been described just now are preferably produced with the aid of a computer program. This computer program to preferably has a program code that is suitable for carrying out the above described method for compensation of the digital measurement signal when it is executed by a computing unit, in particular a microcontroller of a control unit. The program code then includes the calculation of the normalization factor N based on the contents of the first and second memory elements 127a, 127b at time n and the subsequent multiplication of the normalization factor N by the contents of the first memory element 127a at time n. In the case of such a software embodiment, it is possible for the computer program and/or the program code to be stored together with other computer programs for the signal detecting unit on a data medium that is readable by a computer. The data medium can be a diskette, a compact disc (so-called CD), a flash memory, an EPROM, or an EEPROM. The computer program stored on the data medium can then be sold to a customer as a product. In the case of a software embodiment, it is also possible to sell and transmit the program code to a customer, possibly together with other computer programs, without the aid of a data medium via an electronic communication network, in particular on the Internet.

What is claimed is:

1. An electronic circuit for detecting measured quantities, including:
    at least one sensor unit (110) for generating an analog measurement signal, which represents a measured quantity detected by the sensor unit (110);
    a signal detecting unit (120) with a first analog/digital converter (121) for digitizing the analog measurement signal;
    a voltage supply unit (130) that has a first voltage source (132) for producing a first supply voltage (VS1) with an imprecision x1 for the sensor unit (110) and has a second voltage source (134) for producing a second supply voltage (VS2) with an imprecision x2 for the signal detecting unit (120), the imprecisions x1, x2 being transmitted to the measurement signal,
    wherein the signal detecting unit (120) has a correction unit (127) that compensates for the effects of the imprecisions x1 and/or x2 on the digitized measurement signal in response to a digitized voltage signal (U) representing the imprecision x1 of the first supply voltage, and emits a compensated digitized measurement signal (M) resulting from the compensation, and
    a second signal detecting unit (120') that is operated with the first supply voltage (VS1) and includes a second analog/digital converter (122') that digitizes the second supply voltage (VS2) to generate the voltage signal (U), which represents the imprecision x1 of the first supply voltage (VS1), the second analog/digital converter (122') likewise being operated with the first supply voltage (VS1).

2. The electronic circuit as recited in claim 1, wherein the correction unit (127) includes:
    a first memory element (127a) for storing output values of the first analog/digital converter (121),
    a second memory element (127b) for storing values of the digitized voltage signal (U),
    a normalization unit (127d) for generating a normalization factor (N), which is derived from the contents of the two memory elements (127a, 127b) and represents a complement to the imprecisions x1 and/or x2; and
    a multiplying unit (127c) for generating the compensated digitized measurement signal (M) by multiplying the contents of the first memory element (127a) by the normalization factor N, with a delay element (127e) that delays the supplying of the content of the first memory element to the multiplying unit (127c) by the amount of time that it takes to calculate the normalization factor N.

3. The electronic circuit as recited in claim 2, wherein the normalization unit (127d) calculates the normalization factor N as follows: N=content of the first memory element/content of the second memory element.

4. The electronic circuit according to claim 1, which—if the first supply voltage (VS1) is greater than the second supply voltage (VS2)—is characterized by:
   a first voltage divider circuit (R1, R2) for generating the voltage signal (U), which represents the imprecision x1 of the first supply voltage (VS1), through division of the first supply voltage (VS1), preferably in a ratio such that the voltage signal (U) corresponds quantitatively to the second supply voltage (VS2); and
   a second analog/digital converter (122) that is operated with the second supply voltage (VS2) and is for digitizing the voltage signal (U), the second analog/digital converter (122) being preferably associated with the signal detecting unit (120).

5. The electronic circuit according to claim 1, wherein—if the first supply voltage (VS1) is greater than the second supply voltage (VS2)—the sensor unit (110) has a characteristic curve limitation unit (112) for limiting the output voltage of the sensor unit (110) to the level of the second supply voltage (VS2).

6. The electronic circuit according to claim 1, characterized by a second voltage divider circuit (140', 140", and 140''') for dividing the measurement signal generated by the sensor unit (110) before it is output to the first analog/digital converter (121).

7. The electronic circuit as recited in claim 6, wherein the second voltage divider circuit (140') has a voltage divider (R3', R4') connected between the output of the sensor unit (110) and ground, with a pickup point (142') that is connected to the input of the first analog/digital converter (121) of the signal detecting unit (120).

8. The electronic circuit as recited in claim 6, wherein the second voltage divider circuit (140") has a pull-down impedance (R5") connected between the output of the sensor unit (110) and ground and, parallel to this, has a voltage divider (R3", R4") with a pickup point (142") that is connected to the input of the first analog/digital converter (121).

9. The electronic circuit as recited in claim 6, wherein the second voltage divider circuit (140''') has a pull-up resistance (R5''') connected between the output of the sensor unit (110) and the first supply voltage (VS1) and has a voltage divider (R3''', R4''') connected between the output of the sensor unit (110) and ground, with a pickup point (142''') that is connected to the input of the first analog/digital converter (121) of the signal detecting unit (120).

10. A method for operating an electronic circuit for detecting measured values, in particular to compensate for imprecisions x1 and/or x2 in a digitized measurement signal, including the following steps:
   generation by at least one sensor unit (110) of an analog measurement signal, which represents a measured quantity detected by the sensor unit (110);
   digitizing by a signal detecting unit (120) with a first analog/digital converter (121) of the analog measurement signal; and
   production by a voltage supply unit (130) that has a first voltage source (132) of a first supply voltage (VS1) with an imprecision x1 for the sensor unit (110) and production by a second voltage source (134) a second supply voltage (VS2) with an imprecision x2 for the signal detecting unit (120), the imprecisions x1, x2 being transmitted to the measurement signal,
   compensation by a correction unit (127) of the signal detection unit (120) that compensates for the effects of the imprecisions x1 and/or x2 on the digitized measurement signal in response to a digitized voltage signal (U) representing the imprecision x1 of the first supply voltage, and emission of a compensated digitized measurement signal (M) resulting from the compensation;
   provision of a second signal detecting unit (120') that is operated with the first supply voltage (VS1) and includes a second analog/digital converter (122') that digitizes the second supply voltage (VS2) to generate the voltage signal (U), which represents the imprecision x1 of the first supply voltage (VS1), the second analog/digital converter (122") likewise being operated with the first supply voltage (VS1);
   storage of a value of the digitized measurement signal (M) at time n; storage of a value at time n of a voltage signal (U) that represents the imprecision x1 of a first supply voltage (VS1);
   calculation of a normalization factor N by dividing the value of the digitized measurement signal at time n by the value of the voltage signal (U) at time n; and
   generation of a compensated digital measurement signal (M) by multiplying the normalization factor N by the value of the digitized measurement signal at time n.

11. A computing unit, wherein said computing unit is adapted to execute a computer program code for an electronic circuit for detectinq measured values, wherein the computer program code is stored on a data medium that is readable by a computer, and wherein the program code is suitable for carrying out the method as recited in claim 10 when it is executed by a computing unit.

12. A computing unit as recited in claim 11, wherein the computing unit is a microcontroller in a control unit.

13. An electronic circuit for detecting measured quantities, including:
   at least one sensor unit (110) for generating an analog measurement signal, which represents a measured quantity detected by the sensor unit (110);
   a signal detecting unit (120) with a first analog/digital converter (121) for digitizing the analog measurement signal; and
   a voltage supply unit (130) that has a first voltage source (132) for producing a first supply voltage (VS1) with an imprecision x1 for the sensor unit (110) and has a second voltage source (134) for producing a second supply voltage (VS2) with an imprecision x2 for the signal detecting unit (120), the imprecisions x1, x2 being transmitted to the measurement signal,
   wherein the signal detecting unit (120) has a correction unit (127) that compensates for the effects of the imprecisions x1 and/or x2 on the digitized measurement signal in response to a digitized voltage signal (U) representing the imprecision x1 of the first supply voltage, and emits a compensated digitized measurement signal (M) resulting from the compensation, and
   wherein—if the first supply voltage (VS1) is greater than the second supply voltage (VS2)—the sensor unit (110) has a characteristic curve limitation unit (112) for limiting the output voltage of the sensor unit (110) to the level of the second supply voltage (VS2).

* * * * *